(12) United States Patent
Fan et al.

(10) Patent No.: US 12,360,465 B2
(45) Date of Patent: *Jul. 15, 2025

(54) MATERIAL MANAGEMENT METHOD AND SYSTEM

(71) Applicant: Taiwan Semiconductor Manufacturing Co., Ltd., Hsinchu (TW)

(72) Inventors: Rong-Syuan Fan, Hsinchu (TW); Chi-Feng Tung, Hsinchu (TW); Ching-Jung Chang, Hsinchu (TW); Hsiang-Yin Shen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 96 days.

This patent is subject to a terminal disclaimer.

(21) Appl. No.: 18/342,635

(22) Filed: Jun. 27, 2023

(65) Prior Publication Data

US 2023/0341787 A1 Oct. 26, 2023

Related U.S. Application Data

(63) Continuation of application No. 17/476,420, filed on Sep. 15, 2021, now Pat. No. 11,720,033.

(60) Provisional application No. 63/157,066, filed on Mar. 5, 2021.

(51) Int. Cl.
*G03F 7/20* (2006.01)
*G03F 7/00* (2006.01)

(52) U.S. Cl.
CPC ............... *G03F 7/70858* (2013.01)

(58) Field of Classification Search
CPC ...... G03F 7/70858; G03F 7/0012; G03F 7/30; G03F 7/42; G03F 7/16; G06Q 10/06; G06Q 10/06311; G06Q 10/0633; G06Q 10/103; Y02P 90/02; G06F 16/252; G06K 17/0025
See application file for complete search history.

(56) References Cited

U.S. PATENT DOCUMENTS

| | | |
|---|---|---|
| 7,289,867 B1 | 10/2007 | Markle et al. |
| 2007/0185687 A1 | 8/2007 | Speasl et al. |
| 2008/0124648 A1 | 5/2008 | Namatsu et al. |

FOREIGN PATENT DOCUMENTS

CN 112106148 A 12/2020

*Primary Examiner* — Mesfin T Asfaw
(74) *Attorney, Agent, or Firm* — Seed IP Law Group LLP

(57) ABSTRACT

A method includes: storing a carrier containing material in a storage; recording environmental data of the storage to a database while the material is in the storage; generating a forecast for the material in the carrier based on the environmental data; receiving a request for the material from a semiconductor fabrication tool; and providing the carrier to the semiconductor fabrication tool based on the forecast.

20 Claims, 8 Drawing Sheets

MATERIAL MANAGEMENT METHOD AND SYSTEM

PRIORITY CLAIM AND CROSS-REFERENCE

This application is a Continuation of U.S. application Ser. No. 17/476,420, filed Sep. 15, 2021 which claims the benefit of priority to U.S. Provisional Application No. 63/157,066, filed Mar. 5, 2021, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Material management includes tracking, analysis and fulfillment of a variety of chemicals and other production materials used in a multitude of semiconductor manufacturing operations. Materials are generally scrapped after passing their expiration dates to avoid drops in yields or potential damage to sensitive processing tools.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
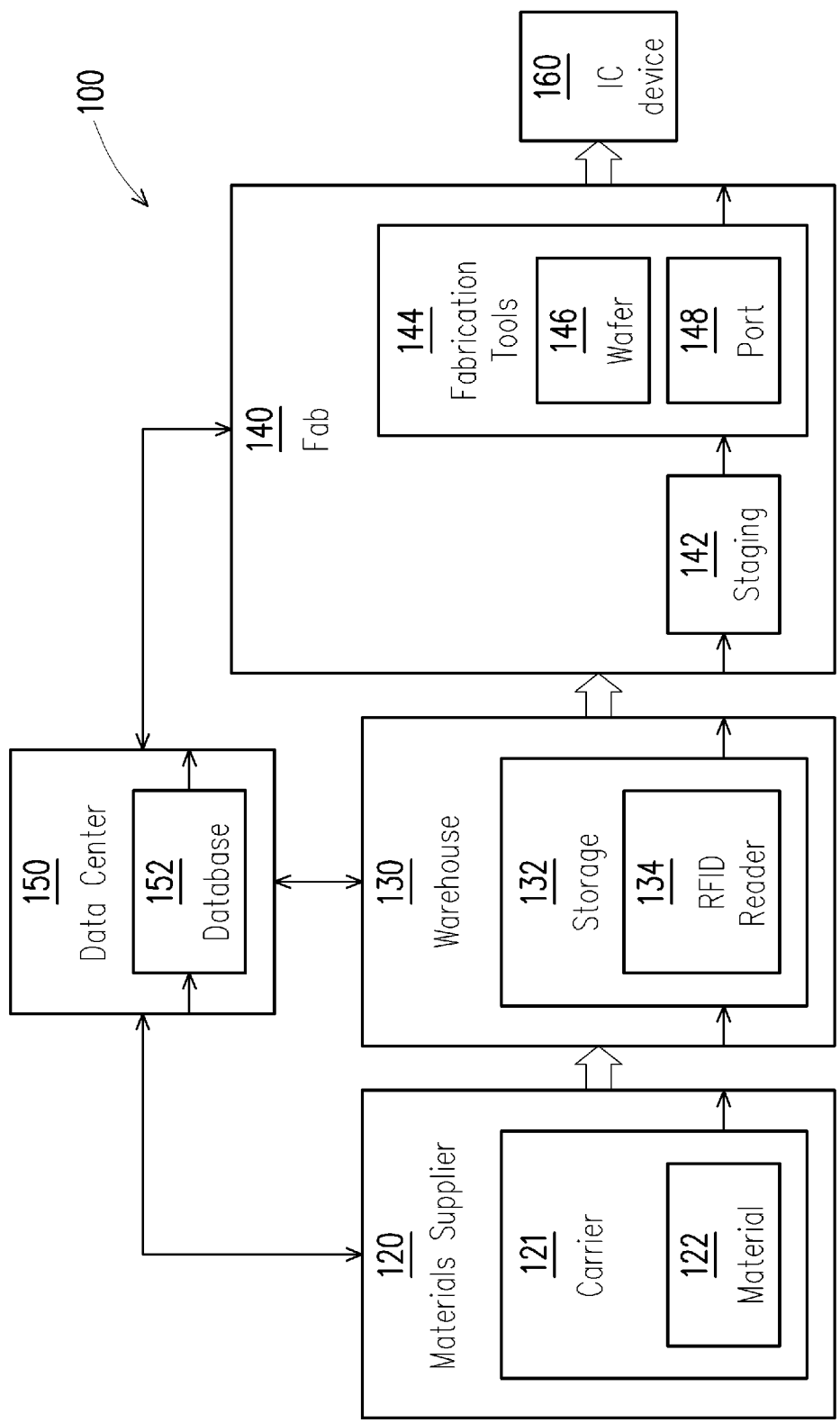
FIGS. 1A-1D are views of a materials management system according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

Semiconductor fabrication generally involves the formation of electronic circuits by performing multiple depositions, etchings, annealings, and/or implantations of material layers, whereby a stack structure including many semiconductor devices and interconnects between is formed. Dimension scaling (down) is one technique employed to fit ever greater numbers of semiconductor devices in the same area. However, dimension scaling is increasingly difficult in advanced technology nodes. Patterning of photoresist layers forms the basis for etching features that are both small and packed closely together. As such, photoresist quality becomes increasingly desirable from a materials management standpoint.

Embodiments of the disclosure include methods and systems for managing materials, such as photoresist, to ensure freshness, safety and timely fulfillment, which increases yield and reduces tool downtime. Material management systems have lacked real-time responsiveness when managing raw material quality and safety. The material management system disclosed herein is capable of substantially real-time response when managing raw material quality and safety. Through intelligent and purposeful use of smart tags and response systems, material aging issues and contamination can be effectively prevented. Environmental sensing and big data collection and forecasting also unlock improved quality control, materials tracking, production reliability, data mining and smart control, while drastically reducing operator error.

Figure 1B:
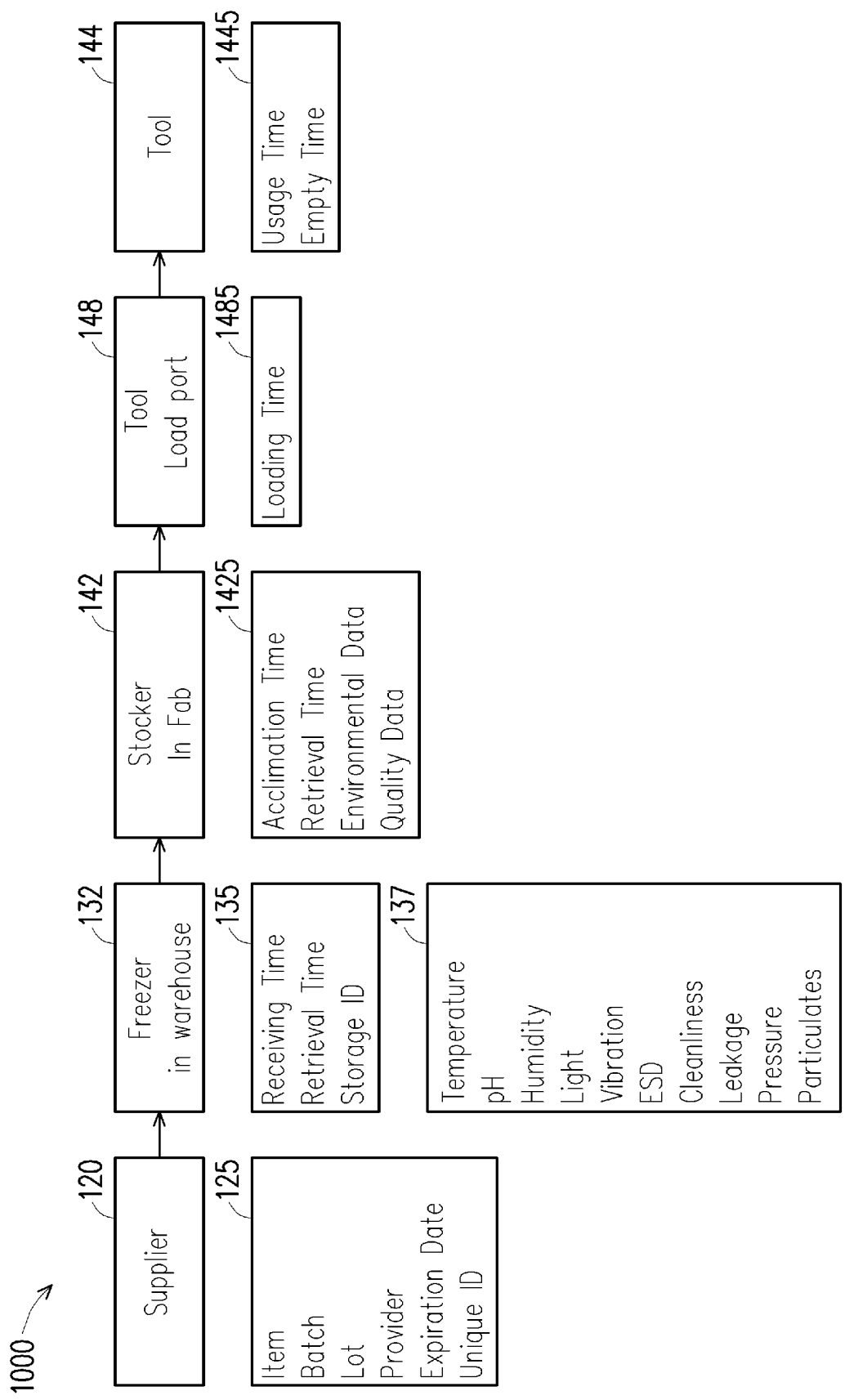
Figure 2A:
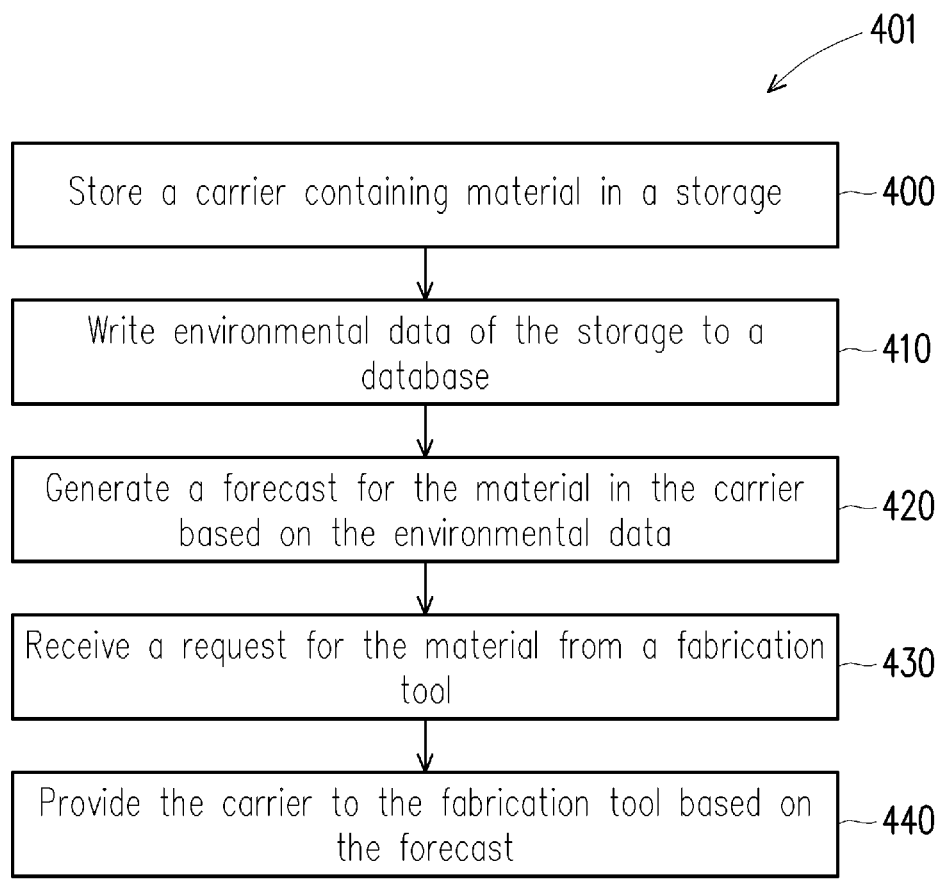
FIGS. 2A-2B are views of a process for managing materials according to various aspects of the present disclosure.
Figure 2B:
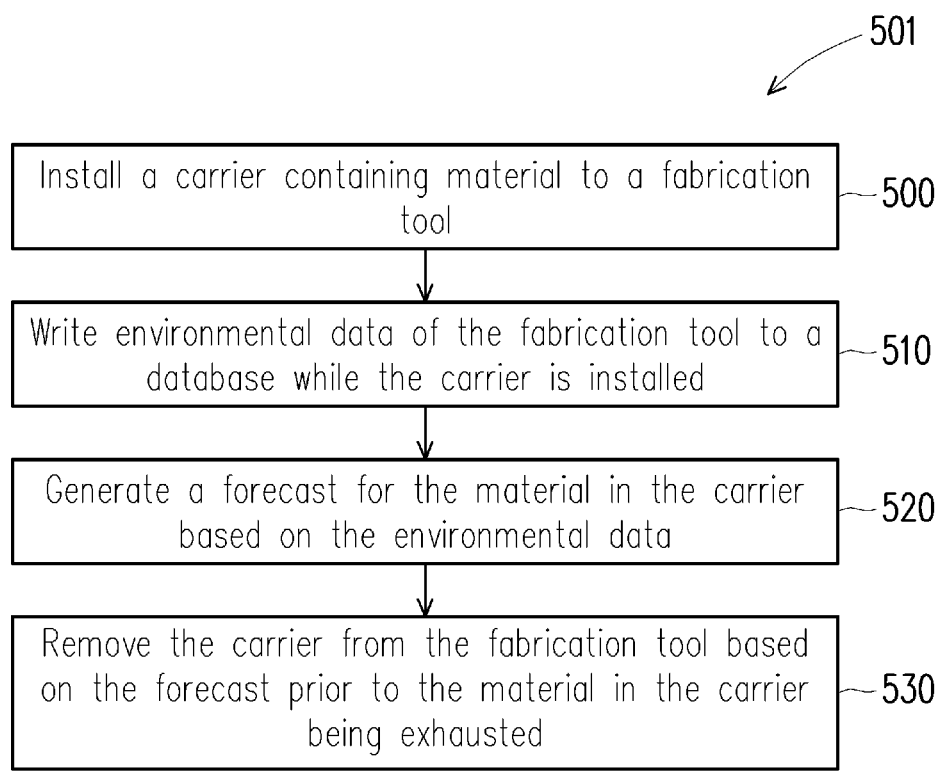

FIG. 1A is a block diagram of an integrated circuit (IC) manufacturing system 100 (or "materials management system 100"), and an IC manufacturing flow associated therewith, in accordance with at least one embodiment of the present disclosure. FIG. 1B is a block diagram illustrating the IC manufacturing flow 1000 in another view in accordance with various embodiments. FIGS. 2A-2B are flowchart diagrams of processes for fabricating an IC device in accordance with various embodiments.

In FIG. 1A, the IC manufacturing system 100 (hereinafter "system 100") includes entities, such as a materials supplier 120, a warehouse 130, an IC manufacturer/fabricator ("fab") 140 and a data center 150, that interact with one another in manufacturing and/or services related to manufacturing an IC device 160. The entities in the system 100 are connected by a communications network. In some embodiments, the communications network is a single network. In some embodiments, the communications network is a variety of different networks, such as an intranet and the Internet. The communications network includes wired and/or wireless communication channels. In some embodiments, the communications network includes short range asset tracking hardware and software, such as radio-frequency identification (RFID), Bluetooth Low Energy (BLE), Wi-Fi, ultra-wideband (UWB), or the like. In some embodiments, the communications network includes wide range asset tracking hardware and software, such as low-power wide-area network (LPWAN), Long-Term Evolution (LTE), 5th generation mobile network (5G), Global Positioning System (GPS), or the like. Each entity interacts with one or more of the other entities and provides services to and/or receives services from one or more of the other entities. In some embodiments, one or more of the materials supplier 120, the warehouse 130, the IC fab 140 and the data center 150 is owned by a single larger company. In some embodiments, one or more of the materials supplier 120, the warehouse 130, the IC fab 140 and the data center 150 coexist in a common facility and use common resources.

With reference to FIG. 1A and FIG. 1B, the materials supplier 120 generates material 122. In some embodiments, the material 122 is a photoresist, however other production materials may be produced in addition to or instead of the photoresist by the materials supplier 120. For example, the materials supplier 120 may design, manufacture and/or distribute materials for lithography, such as photoresists, anti-reflective coatings, overcoats, developers, removers, polymers, strippers, or the like. In some embodiments, the materials supplier 120 further or instead designs and/or manufactures materials for planarization (e.g., chemical mechanical planarization), such as slurries, cleaners, or the like. In some embodiments, the materials supplier 120 further or instead designs and/or manufactures materials for packaging, such as adhesives, encapsulants, thermal compounds, or the like.

The materials supplier 120 may further package the material 122 in a container, for example into a carrier 121, such as a bottle made of glass, plastic, or another suitable material. In some embodiments, the carrier 121 has volume less than about 100 liters, less than about 80 liters, less than about 50 liters, or another suitable volume. In some embodiments, the volume of the carrier 121 is greater than 100 liters. The materials supplier 120 may further label the container by a tag. In some embodiments, the tag is a read-only tag, such as a barcode, a Quick Response (QR) code, or the like. In some embodiments, the tag is a read/write tag, such as an RFID tag, a Near-Field Communications (NFC) tag, or the like. In some embodiments, the container is labeled by more than one tag, e.g., the read-only tag and the read/write tag. As shown in FIG. 1B, in some embodiments, the tag(s) includes information 125, such as an item identifier, a batch identifier, a lot identifier, a provider identifier, an expiration date, a unique identifier (ID) or the like. In some embodiments, the materials supplier 120 writes the information 125 contained in the tag(s) to a database 152 of the data center 150, as shown in FIG. 1A.

In some embodiments, the carrier 121 includes at least one safety mechanism in/on the carrier 121, which may include an anti-drop mechanism, a leakage isolation, an air exhaust mechanism, and/or an air purge mechanism. In some embodiments, when any of the safety mechanisms is activated, information about the safety mechanism activation (e.g., event time, event measurement, or the like) is recorded in the database 152. The information may be used to forecast expiration and/or safety of the materials 122. In some embodiments, the expiration is related to aging of the materials 122 due to time, and as well may be accelerated by exposure to a host of environmental conditions, including temperature, pressure, light, humidity and the like.

In some embodiments, the material 122 is transported from the materials supplier 120 to the warehouse 130 in a transport vehicle. In some embodiments, trip information, including one or more of real-time location, route, trip distance, trip duration, and/or other suitable trip parameters, is recorded in the database 152. For example, the transport vehicle may be equipped with an RFID reader and a GPS (or other navigation system) receiver. When the material 122 enters the transport vehicle (e.g., at the materials supplier 120), the RFID reader may identify the material 122 by the RFID tag associated with the material 122, and generate an entry timestamp signifying time when the material 122 enters the transport vehicle. In some embodiments, the transport vehicle includes environmental control and/or monitoring systems, which may control and/or monitor temperature, air cleanliness, light, vibration, and other suitable environmental parameters. As the transport vehicle is in transit from the materials supplier 120, the transit vehicle may record the environmental parameters for upload to the database 152. In some embodiments, the upload is performed in real-time along the transit route. In some embodiments, the upload is performed in a batch upon arrival at the materials supplier 120 or at a suitable time thereafter. Following arrival at the warehouse 130, when the material 122 leaves the transport vehicle, the RFID reader may again identify the material 122 by the RFID tag associated with the material 122, and generate an exit timestamp signifying time when the material 122 exits the transport vehicle.

Figure 1C:
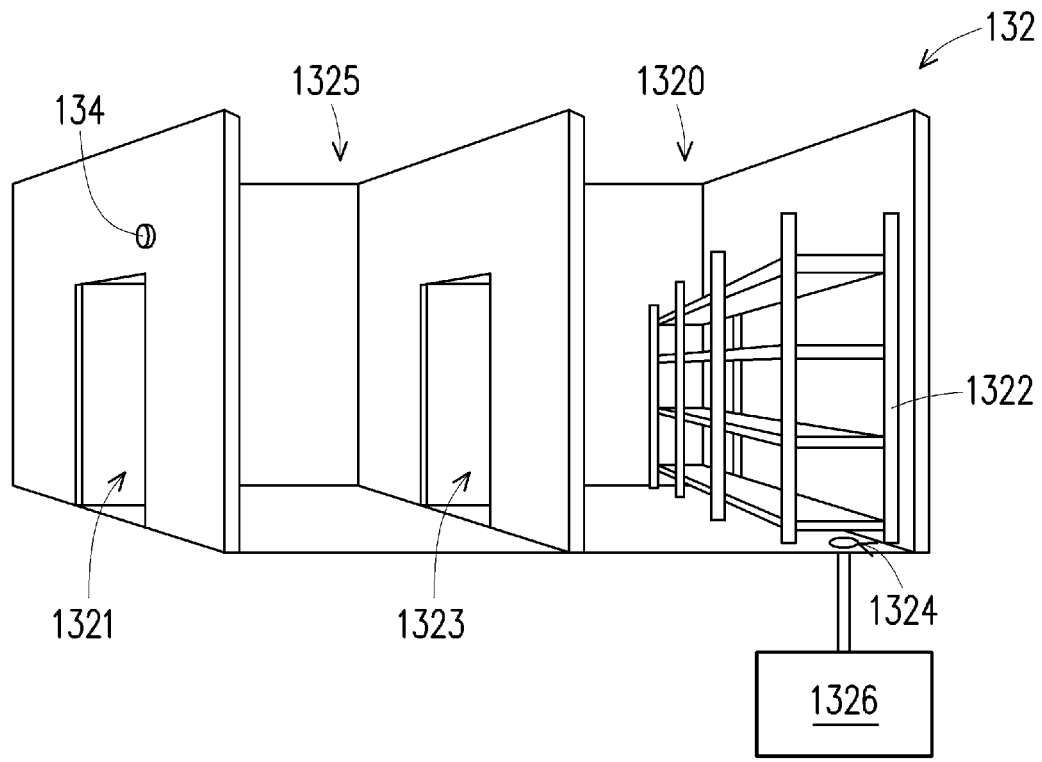

The warehouse 130 includes storage 132. FIG. 1C is a diagram illustrating the storage 132 in accordance with various embodiments. In some embodiments, the warehouse 130 performs materials intake, storage and fulfillment. The warehouse 130 receives the material 122 from the materials supplier 120, and may perform at least one intake inspection, including for quality, safety, or other suitable parameters. In some embodiments, the intake inspection includes obtaining the information 125 about the material 122 by scanning the tag. In some embodiments, obtaining the information 125 includes decoding the information 125 from image, text or other data received immediately from scanning the tag (e.g., the information 125 encoded and stored in the tag itself). In some embodiments, obtaining the information 125 includes decoding at least the unique ID from image, text or other data received immediately from scanning the tag, querying the database 152 by sending a query including at least the unique ID to the data center 150, and receiving the information 125 from the database 152. In some embodiments, the information 125 includes the item identifier, batch identifier, lot identifier, provider identifier, expiration date or the like, as described above.

Based on the information 125 received from the tag and/or the database 152, the warehouse 130 may accept the materials 122. In some embodiments, if an irregularity is found in any of the information 125 of the materials 122, the warehouse 130 may reject the materials 122. For example, if the materials 122 are mislabeled, e.g., the item identifier does not match a known physical appearance of the materials 122, the warehouse 130 may determine that the wrong tag was applied to the materials 122, and request a return of the materials 122 to the materials supplier 120. In some embodiments, if no irregularity is found, the warehouse 130 may accept the materials 122.

Accepted materials 122 are stored in the storage 132, corresponding to operation 400 of process 401 illustrated in FIG. 2A. Upon accepting the materials 122, the warehouse 130 may update the database 152 to record warehouse information 135 (see FIG. 1B), which may include a receiving time. The warehouse information 135 may further include a retrieval time, a storage identifier (ID), and other suitable information pertaining to the storage 132. The receiving time may include a date and time when the materials 122 are received at the warehouse 130. The materials 122 are stored in the storage 132, which may be or include a storage room 1320 and an interlock 1325, in some embodiments. In some embodiments, the storage 132 includes one or more shelves 1322 in the storage room 1320. In some embodiments, the shelves 1322 are enclosed in a cabinet, such as a freezer, which may maintain a temperature below 0° C., though cabinets which maintain higher temperatures may also be appropriate depending on the type of the materials 122 stored therein. In some embodiments, each shelf 1322 includes a weight sensor (not separately illustrated) for measuring weight loading on the shelf 1322 by objects (e.g., the materials 122) thereon.

The storage 132 may include an RFID reader 134, such that an accurate record may be kept of how long the materials 122 are stored in the storage 132. In some embodiments, the RFID reader 134 is in communication with the database 152. In some embodiments, when the RFID reader 134 detects and/or reads the tag on the materials 122, and determines that the materials 122 are entering the storage 132, the RFID reader 134 associates an entry timestamp with the materials 122. The RFID reader 134 may update the database 152 to record the entry timestamp associated with the storage ID that uniquely identifies the storage 132 in which the materials 122 are stored. In some embodiments, the storage ID includes a location of the storage 132. In some embodiments, the location includes a building/facility name/identifier, a floor of the building/facility, a room of the building/facility, and/or one or more other suitable identification values. In some embodiments, the storage ID further includes a unique storage unit identifier. In some embodiments, the unique storage unit identifier includes a make and/or model of the storage 132, a condition (e.g., age, maintenance record, or the like) of the storage 132, functions (e.g., leakage detection) of the storage 132, and the like.

The storage 132 may include environmental, quality, safety, and access monitoring and/or management (e.g., controls). In some embodiments, the storage 132 includes environmental and/or quality controls and/or monitoring, including temperature, pH ("potential of hydrogen"), humidity, light, vibration, electrostatic discharge (ESD), cleanliness, leakage, pressure, particulate, and other suitable controls and/or monitoring. In some embodiments, the storage 132 periodically records to the database 152 environmental and/or quality information 137 corresponding to the environmental and/or quality controls and/or monitoring just described, corresponding to operation 410 of process 401 illustrated in FIG. 2A. In some embodiments, the periodic recording of the environmental and/or quality information 137 is performed independent of presence of the materials 122 in the storage 132. For example, the database 152 may be a relational database, and the environmental and/or quality information 137 may be stored in a first table, and the entry timestamp and an exit timestamp (described below with reference to the staging 142) may be stored in a second table that may be linked to the first table.

In some embodiments, the storage 132 further includes safety monitoring and/or controls, which includes access monitoring and/or control. For example, the materials 122 may be transferred to the storage 132 by an operator (e.g., human or robotic). In some embodiments, the operator may carry a keycard, key fob, or other electronically-readable access device. In some embodiments, to store the materials 122 in the storage 132, an electronic access reader (not separately illustrated) reads the access device of the operator, and unlocks the storage 132 to receive the materials 122 when the operator is authorized to access the storage 132. For example, an outer door 1321 of the interlock 1325 may open while an inner door 1323 of the interlock 1325 is closed. Following closure of the outer door 1321, and an optional cleaning process in the interlock 1325 to remove, for example, particulates, the inner door 1323 may open to allow access by the operator transferring the materials 122 to the storage room 1320. In some embodiments, the electronic access reader updates the database 152 with operator information stored on the electronically-readable access device and/or corresponding to the operator information stored thereon. In some embodiments, the operator information stored on the electronically-readable access device includes a personnel identifier, which may include a vendor/contractor company name, an employee number/code, and the like.

In some embodiments, the safety monitoring and/or controls include one or more safety sensors, such as the weight sensor, a position sensor, an interlock sensor, and/or other suitable safety sensors. As mentioned previously, each shelf 1322 may include a weight sensor configured to measure weight loading on the shelf 1322 by objects (e.g., the materials 122) thereon. In some embodiments, the weight sensor includes at least one of a strain gauge, a capacitive sensor, a hydraulic sensor, a pneumatic sensor, or other suitable weight sensor. In some embodiments, the weight sensor takes periodic and/or asynchronous weight readings, and the weight readings may be recorded in the database 152 by the weight sensor or by a controller networked with the weight sensor.

The position sensor may be located on or near the shelf 1322 for sensing presence or absence of the materials 122 at, for example, a designated region of the shelf 1322. In some embodiments, the position sensor includes at least a camera, a proximity sensor (e.g., an infrared sensor), or other suitable position sensor capable of detecting presence or absence of the materials 122. In some embodiments, the position sensor takes periodic and/or asynchronous position/proximity readings, and the position/proximity readings may be recorded in the database 152 by the position sensor or by a controller networked with the position sensor.

The interlock sensor may be located on or near the outer door 1321 and/or the inner door 1323 for sensing status of the interlock 1325. In some embodiments, the interlock sensor includes at least one sensor capable of detecting status of the outer door 1321 and/or the inner door 1323. For example, the status may include whether the outer or inner door 1321, 1323 is open or closed, or whether the interlock 1325 is sealed, the outer door 1321 has broken seal, or the inner door 1323 has broken seal. In some embodiments, the interlock sensor includes a magnetic contact sensor, which may detect loss of contact when the outer or inner door 1321, 1323 is open and/or presence of contact when the outer or inner door 1321, 1323 is closed. In some embodiments, the interlock sensor takes periodic and/or asynchronous interlock status readings, and the interlock status readings may be recorded in the database 152 by the interlock sensor or by a controller networked with the interlock sensor.

In some embodiments, the storage 132 stores the materials 122 for a period of time prior to fulfillment of the materials 122 to the fab 140. In some embodiments, the storage 132 periodically updates the database 152 with storage data, including temperature data, humidity data, pressure data, particulate data, other environmental control data, safety data and/or other monitoring data. For example, the storage 132 may write the storage data to the database 152 periodically every 1 minute, every 5 minutes, or another suitable interval.

In some embodiments, the storage 132 may also write the storage data to the database 152 in an aperiodic manner, such as upon detection of an interrupt condition. In some embodiments, the interrupt condition may include one or more of a safety condition, an environmental condition, or other suitable condition. For example, the safety condition may include detection of a leak of the materials 122 in the storage 132. In some embodiments, the leak of the materials 122 is detected by a leak detector 1326, which may collect and analyze fluids from a drain 1324 at a floor of the storage 132. If the fluids collected include the materials 122, e.g., a photoresist, the leak detector 1326 may generate safety data, including a timestamp corresponding to detection of the leak, and a material identifier corresponding to chemical analysis of the fluids.

In some embodiments, the environmental condition may include the temperature, humidity, pressure, particulate, and other environmental controls and/or monitoring being above or below a threshold. For example, if the temperature exceeds −5° C., quality data may be generated, including a timestamp and measured temperature (e.g., −3° C.) corresponding to detection of the temperature. Upon detection of the interrupt condition, such as the safety condition or the environmental condition, the storage 132 may write the safety data or the quality data to the database 152.

Description of writing the safety or quality data to the database 152 is described in terms of an aperiodic (or asynchronous) update. In some embodiments, the storage 132 may delay writing the safety or quality data to the database 152 so as to update the database 152 synchronously with the periodically updated data, such as the temperature data, humidity data, pressure data, particulate data, other environmental control data, and/or other monitoring data. In such a situation, where data having duplicate type is written (e.g., periodic temperature data and interrupt-originating temperature data), the two or more data entries may be identified uniquely, for example, by a flag or other appropriate identifier.

The warehouse 130 further performs fulfillment of the materials 122 to the fab 140. In some embodiments, the warehouse 130 receives a request from the data center 150 to transfer the materials 122 to the fab 140. In some embodiments, the request to transfer the materials 122 from the warehouse 130 to the fab 140 is generated by the fab 140. In some embodiments, the request is generated by the data center 150. In some embodiments, the fab 140 is an IC fabrication entity that includes one or more manufacturing facilities for the fabrication of a variety of different IC products. In some embodiments, the fab 140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

The fab 140 includes wafer fabrication tools 144 (hereinafter "fabrication tools 144") configured to execute various manufacturing operations on semiconductor wafer 146 such that IC device 160 is fabricated. In various embodiments, fabrication tools 144 include one or more of a wafer stepper, an ion implanter, a photoresist coater, a process chamber, e.g., a CVD chamber or LPCVD furnace, a chemical-mechanical planarization (CMP) system, a plasma etch system, a wafer cleaning system, or other manufacturing equipment capable of performing one or more suitable manufacturing processes as discussed herein. In some embodiments, the materials 122 may be installed in the fabrication tools 144 for performing semiconductor fabrication processing, such as coating the wafer 146 with photoresist.

Figure 1D:
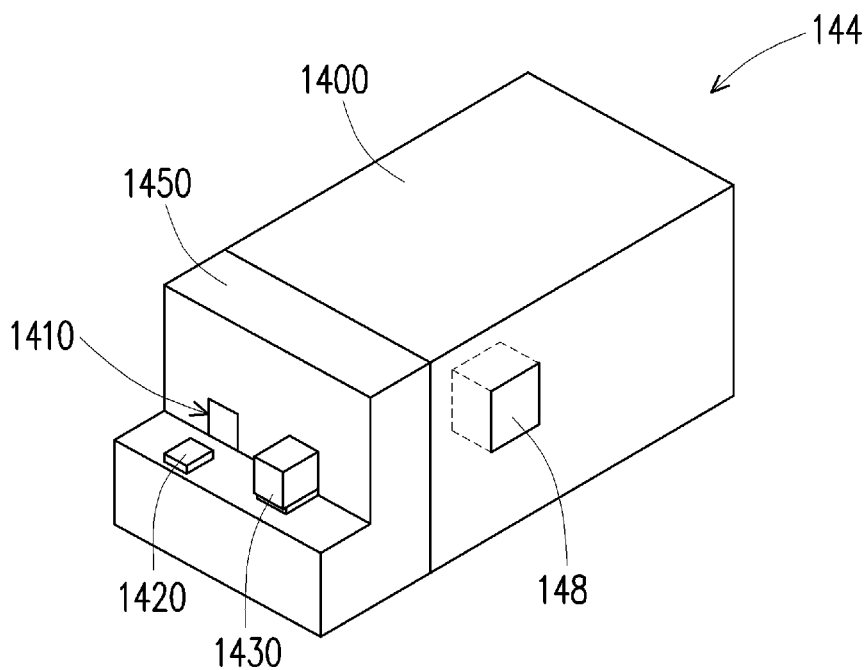

FIG. 1D is a perspective view of the fabrication tool 144 in accordance with various embodiments. An access port 1450 of the fabrication tool 144 is configured to transfer semiconductor wafers (e.g., the wafer 146) in/out of a processing chamber 1400. The access port 1450 includes at least one access interface 1410, such as a door, and at least one corresponding carrier stage 1420 aligned with the corresponding access interface 1410. A carrier 1430 (which may be similar to the carrier 121) holding at least one wafer (e.g., the wafer 146) may be positioned onto the carrier stage 1420, and the wafer may be retrieved from the carrier 1430 through the access interface 1410, for example, by a robotic arm. After entering the access port 1450, the wafer may be transferred to the processing chamber 1400 for performing at least one semiconductor fabrication process, such as implantation, photoresist coating, annealing, deposition, etching, planarization, cleaning, or other suitable process.

The fabrication tool 144 further includes a materials installation port 148, which may include a door and an enclosure. The materials 122 may be installed in the fabrication tool 144 by opening the door, and positioning the carrier 121 containing the materials 122 in the enclosure, for example, by an operator. In some embodiments, the carrier 121 is further in fluidic communication with the processing chamber 1400 following installation into the enclosure. For example, a tube or other fluid transfer conduit may be attached to the carrier 121 containing the materials 122 to provide fluidic communication between the carrier 121 and a dispenser (e.g., a nozzle) in the processing chamber 1400. In some embodiments, the materials 122 are a photoresist, and the dispenser includes a nozzle for dripping or spraying the photoresist onto the wafer 146.

Prior to installing the materials 122 in the fabrication tool 144, temperature of the materials 122 may be raised to room temperature or another suitable temperature for semiconductor fabrication processing. In some embodiments, the fab 140 includes a staging area 142 (or "stocker 142"), which may be similar to the storage 132, and is used for acclimating (e.g., raising the temperature) the materials 122 to prepare the materials 122 for installation to the fabrication tool 144. When the materials 122 are a photoresist, for example, the staging area 142 may have an ambient temperature above 0° C., such as room temperature, or another suitable ambient temperature, so as to perform acclimation of the photoresist, which may be at a temperature below about 0° C. after removal from the storage 132 and transit to the staging area 142. The acclimation may be performed for an acclimation period of time that is related to volume, initial temperature (e.g., <0° C.) and target temperature (e.g., about 20° C. to about 25° C.) of the materials 122.

In some embodiments, the staging area 142 may include an RFID reader, such that an accurate record may be kept of how long the materials 122 are stored in the staging area 142. In some embodiments, the RFID reader is in communication with the database 152. In some embodiments, when the RFID reader detects and/or reads the tag on the materials 122, and determines that the materials 122 are entering the staging area 142, the RFID reader associates an entry timestamp with the materials 122. The RFID reader may update the database 152 to record the entry timestamp associated with a staging area ID that uniquely identifies the staging area in which the materials 122 are stored, which may be part of staging information 1425 (see FIG. 1B).

The staging area 142 may include environmental, quality, safety, and access monitoring and/or management (e.g., controls). In some embodiments, the staging area 142 includes environmental and/or quality controls and/or monitoring, including temperature, humidity, light, vibration, electrostatic discharge (ESD), and other suitable controls and/or monitoring. In some embodiments, the staging area 142 periodically records to the database 152 environmental and/or quality information as part of the staging information 1425 (see FIG. 1B), which may correspond to the environmental and/or quality controls and/or monitoring just described. In some embodiments, the periodic recording of the environmental and/or quality information is performed independent of presence of the materials 122 in the staging area 142. For example, the database 152 may be a relational database, and the environmental and/or quality information 137 may be stored in a first table, and the entry timestamp and an exit timestamp (described below) may be stored in a second table that may be linked to the first table.

In some embodiments, the staging area 142 further includes safety monitoring and/or controls, which includes access monitoring and/or control. For example, the materials 122 may be transferred to the staging area 142 by an operator (e.g., human or robotic). In some embodiments, the operator may carry a keycard, key fob, or other electronically-readable access device. In some embodiments, to store the materials 122 in the staging area 142, an electronic access reader (not separately illustrated) reads the access device of the operator, and unlocks the staging area 142 to receive the materials 122 when the operator is authorized to access the staging area 142. In some embodiments, the electronic access reader updates the database 152 with operator information stored on the electronically-readable access device and/or corresponding to the operator information stored thereon. In some embodiments, the operator information stored on the electronically-readable access device includes a personnel identifier, which may include a vendor/contractor company name, an employee number/code, and the like.

The staging area 142 further performs fulfillment of the materials 122 to the fabrication tool 144. In some embodiments, the staging area 142 receives a request for transfer of the materials 122 to the fabrication tool 144, for example, for installation to the fabrication tool 144, corresponding to operation 430 of process 401 illustrated in FIG. 2A. In some embodiments, the request originates from the data center 150 to transfer the materials 122 to the fabrication tool 144. In some embodiments, the request to transfer the materials 122 from the staging area 142 to the fabrication tool 144 is generated by the fabrication tool 144 or an operator of the fabrication tool 144. In some embodiments, the request is generated by the data center 150, for example, based on a production schedule, a forecast of usage of the materials 122 by the fabrication tool 144, and/or other suitable parameters.

Based on a forecast, which is described in greater detail with reference to FIGS. 3A-3C, the carrier 121 containing the materials 122 may be provided to the fabrication tool 144. Similar to transfer of the materials 122 to the staging area 142, in some embodiments, when a request is received to transfer the materials 122 to the fabrication tool 144, an operator with an electronically-readable access device retrieves the materials 122 from the staging area 142, and transfers the materials 122 to the fabrication tool 144. In some embodiments, access by the operator is verified and recorded by the staging area 142. In some embodiments, a retrieval time corresponding to the time the materials 122 leave the staging area 142 (e.g., as detected by the RFID reader) is recorded in the database 152 as part of the staging information 1425. In some embodiments, upon leaving the staging area 142, content of the materials 122 is verified to ensure that the materials 122 match the request, for example, having the same item, batch and lot identifiers specified in the request.

To ensure the fabrication tool 144 receives the correct materials 122, lot identifier of the materials 122 may be retrieved and compared to the request. In some embodiments, the materials 122 are verified for correctness prior to leaving the staging area 142 and/or prior to installation into the fabrication tool 144. For photoresist, acclimation time may further be verified to ensure that the materials 122 have spent sufficient time in the staging area 142 to reach an acclimation temperature, such as room temperature, as described above. This avoids damage to the fabrication tool 144 or negative impact to yield that may occur by using the materials 122 at too low a temperature (e.g., prior to achieving acclimation).

The materials 122 retrieved from the staging area 142 are installed in the fabrication tool 144, corresponding to operation 500 of process 501 illustrated in FIG. 2B. In some embodiments, the fabrication tool 144 includes an RFID reader, for example, at or near the materials installation port 148. The RFID reader may read the tag on the carrier 121 containing the materials 122, and a loading timestamp may be recorded corresponding to time when the materials 122 are installed in the materials installation port 148. The loading timestamp may be a part of tool loading information 1485 (see FIG. 1B), which may be recorded in the database 152 periodically or aperiodically/asynchronously. For example, the loading timestamp may be recorded to the database 152 by the fabrication tool 144 within seconds of the RFID reader identifying the materials 122. In some embodiments, the operator may make a data entry signifying that the materials 122 are installed in the materials installation port 148. In some embodiments, the door of the materials installation port 148 may include an access sensor, such as a magnetic contact sensor, and any opening and/or closing of the door may be recorded in the database 152. In some embodiments, the enclosure of the materials installation port 148 may include a proximity sensor, such as an infrared sensor, and/or a weight sensor. In some embodiments, tracking of installation of the materials 122 to the materials installation port 148 may include reading the tag by the RFID reader, detecting opening of the door by the access sensor, detecting proximity of the materials 122 by the proximity sensor, detecting closing of the door by the access sensor, and/or receiving the data entry by the operator. In some embodiments, data associated with the tracking of installation may be recorded to the database 152.

In the fabrication tool 144, tool information 1445 (see FIG. 1B) corresponding to the materials 122 may be recorded in the database 152, corresponding to operation 510 of process 501 illustrated in FIG. 2B. In some embodiments, the tool information 1445 includes usage time, which may include a time value in hours, minutes and seconds representing time the materials 122 are present in the fabrication tool 144. In some embodiments, the usage time represents time the materials 122 are in use in the fabrication tool 144, such as time in which the materials 122 are consumed by the fabrication tool 144, without including time in which the materials 122 are not consumed by the fabrication tool 144, such as when the fabrication tool 144 is idle or when no transfer of the materials 122 from the carrier 121 to the processing chamber 1400 occurs (e.g., outflow of the materials 122 from the carrier 121 is substantially zero). In some embodiments, the tool information 1445 further includes environmental data of the fabrication tool 144, such as temperature, pressure, humidity, light, process parameters, or other suitable environmental data. The environmental data may be recorded to the database 152 on a continual basis, periodically and/or aperiodically, corresponding to operation 520 of process 501 illustrated in FIG. 2B.

One consideration for use of the materials 122 in the fabrication tool 144 corresponds to expiration status of the materials 122. By tracking environmental, quality and safety data of the materials 122 from the materials supplier 120 to the warehouse 130, and from the warehouse 130 to the fab 140, a very accurate forecast of expiration status of the materials 122 may be achieved (which may correspond to operation 430 of FIG. 2A and/or operation 520 of FIG. 2B), such that expiration status of the materials 122 may be monitored in real-time even when the materials 122 are in the fabrication tool 144. In some embodiments, supply of the materials 122 (e.g., outflow from the carrier 121 to the processing chamber 1400) may be cut off when the materials 122 expire, even if the expiration occurs while the materials 122 are in the fabrication tool 144. The carrier 121 containing the materials 122 may be removed from the fabrication tool 144 while not empty (e.g., some of the materials 122 are still in the carrier 121), which may correspond to operation 530 of FIG. 2B, and new materials that are not yet expired may be requested from, for example, the staging area 142. In some embodiments, retrieval of the materials 122 from the staging area 142 may be intelligently managed by use of the database 152 in conjunction with, for example, a first-in-first-out (FIFO) assignment by lot, which may reduce expiration risk.

In some embodiments, the FIFO assignment is based on the forecast of the expiration status of many different carriers containing the materials 122, such that the carrier 121 containing the materials 122 nearest expiration based on the forecast is retrieved and transferred to the fabrication tool 144 before retrieving other carriers with longer expiration. In some embodiments, production schedule is taken into account with respect to the FIFO assignment. For example, if two carriers containing the same materials 122 and having similar forecasted expiration are both acclimated (ready) and present at the staging area 142, and a first of the two carriers has lower remaining materials 122 than a second of the two carriers, if the production schedule indicates a relatively low forecasted materials volume to be consumed, the first carrier having the lower volume of materials 122 may be retrieved before/instead of the second carrier, even if the forecasted expiration of the first carrier is somewhat later than the forecasted expiration of the second carrier.

The system 100 is shown as having the materials supplier 120, the warehouse 130, the IC fab 140 or the data center 150 as separate components or entities. However, it is understood that one or more of the materials supplier 120, the warehouse 130, the IC fab 140 or the data center 150 are part of the same component or entity.

Figure 3A:
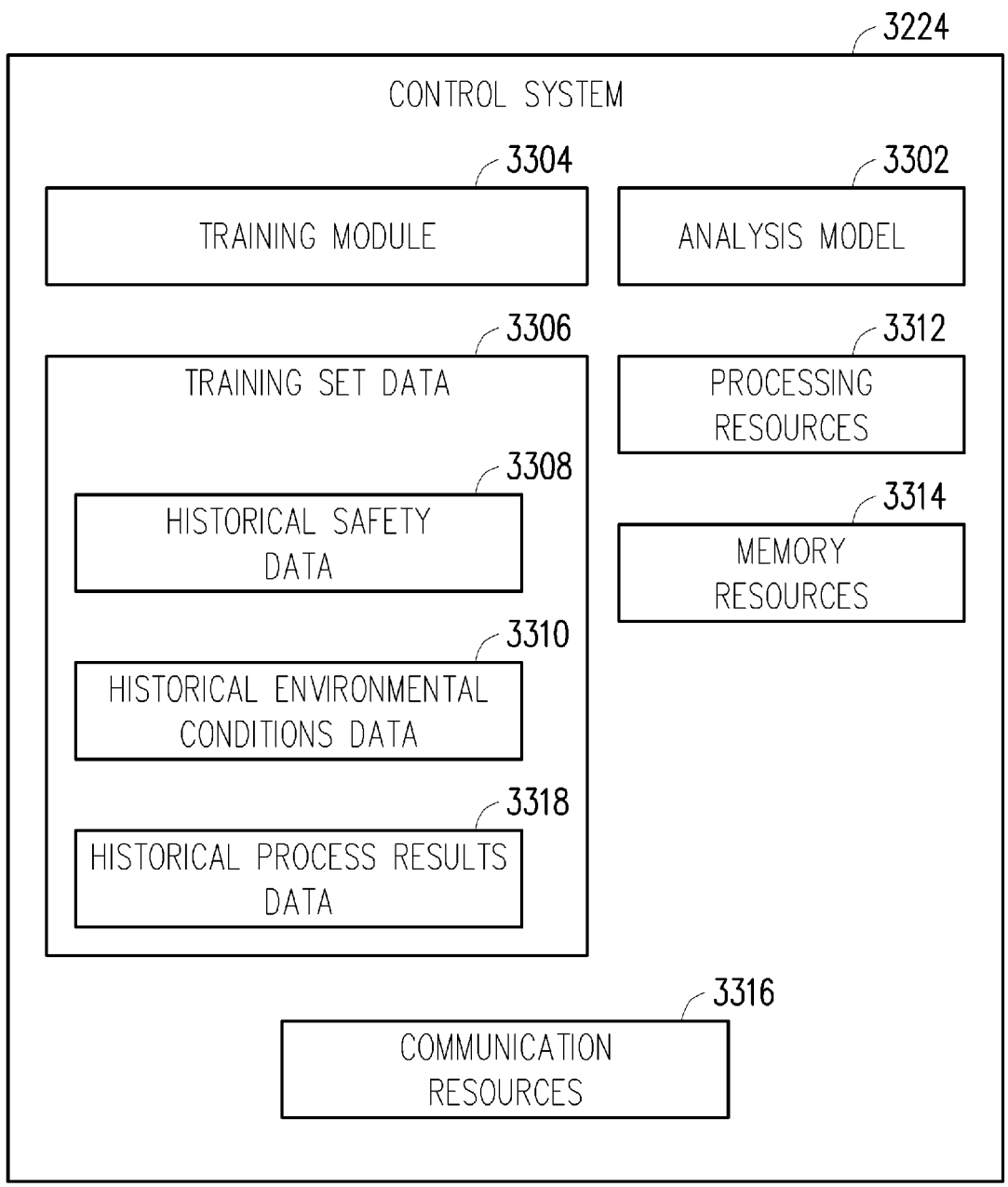
FIGS. 3A-3C are views illustrating a method of forecasting materials quality/safety according to various aspects of the present disclosure.
Figure 3B:
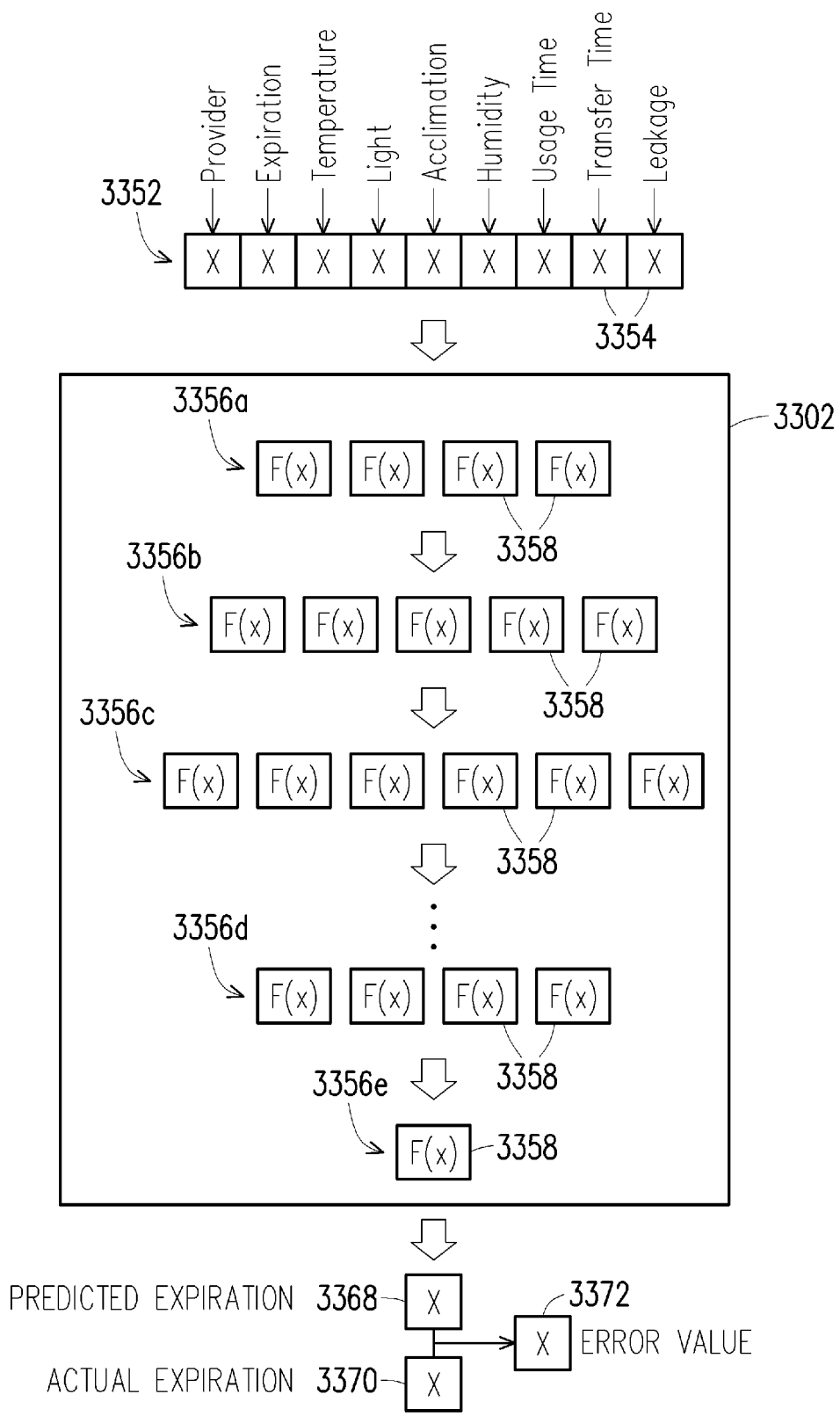
Figure 3C:
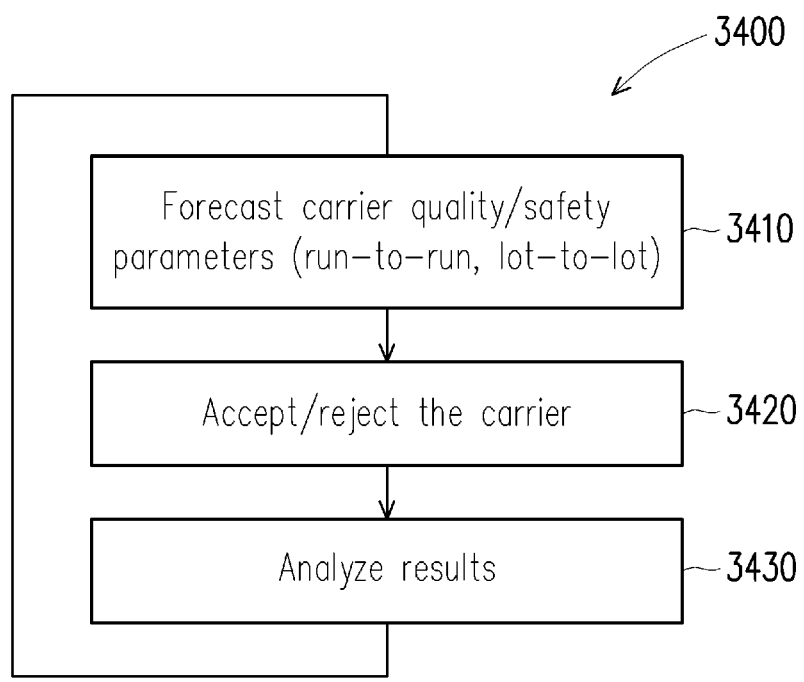

FIGS. 3A-3C are views illustrating forecasting of various parameters corresponding to the materials 122 in accordance with various embodiments. A number of forecasts may be made by a microcontroller unit (MCU) using information stored in the database 152. In some embodiments, the forecasts include quality parameters (e.g., expiration) and/or safety parameters (e.g., leakage) of the materials 122, consumption of the materials 122, order of transfer of the materials 122 from the warehouse 130 and/or the staging area 142, procurement of the materials 122 from the materials supplier 120, control/management of inventory of the materials 122, and/or other suitable forecasts.

FIG. 3A is a block diagram of a system 3224, which may be a control system for performing the operation 420 of FIG. 2A or the operation 520 of FIG. 2B, according to one embodiment. The control system 3224 utilizes machine learning to forecast parameters corresponding to the materials 122.

In one embodiment, the control system 3224 includes an analysis model 3302 and a training module 3304. The training module 3304 trains the analysis model 3302 with a machine learning process. The machine learning process trains the analysis model 3302 to select the carrier 121 containing the materials 122 according to quality and/or safety parameters, in some embodiments. Although the training module 3304 is shown as being separate from the analysis model 3302, in practice, the training module 3304 may be part of the analysis model 3302.

The control system 3224 includes, or stores, training set data 3306. The training set data 3306 includes historical safety data 3308, historical environmental conditions data 3310 and historical process results data 3318. The historical safety data 3308 includes data related to safety of the materials 122. The historical environmental conditions data 3310 includes data related to the environment(s) in which the materials 122 have been present. The historical process results data 3318 includes data related to wafer quality following fabrication processes in which the materials 122 have been present. As will be set forth in more detail below, the training module 3304 utilizes the historical safety data 3308, the historical environmental conditions data 3310 and the historical process results data 3318 to train the analysis model 3302 with a machine learning process.

In one embodiment, the historical safety data 3308 includes data related to safety parameters such as location, position, chemical control banding, access rights, recipe management system, drop events, leakage events, exhausting/purging events, or other suitable safety data. For example, thousands or millions of readings of the above safety parameters may be generated over the course of several hours or days. After each generation, safety of the materials 122 may be calculated. The historical safety data 3308 includes the safety parameters of each carrier 121 of the materials 122. Accordingly, the historical safety data 3308 can include safety data for a large number of carriers of the materials 122. In some embodiments, the safety data is generated on a run-by-run basis or a lot-by-lot basis.

In one embodiment, the historical environmental conditions data 3310 include various environmental conditions or parameters during transfer and/or storage of the materials 122. Accordingly, for each carrier 121 of the materials 122 having data in the historical safety data 3308, the historical environmental conditions data 3310 can include the environmental conditions or parameters that were present during transfer and/or storage of the materials 122. For example, the historical environmental conditions data 3310 can include data related to the temperature, pH, humidity, light, acclimation time, vibration, ESD, cleanliness, production schedule, and/or other suitable environmental conditions parameters.

In one embodiment, the historical process results data 3318 include various wafer quality parameters resulting directly or indirectly from use of the materials 122 in a semiconductor fabrication process. For example, the materials 122 may be used in a photoresist coating process, a planarization process, a cleaning process, a deposition process, or other suitable fabrication process. In some embodiments, the historical process results data 3318 may include measurements of an etch profile following the photoresist coating process. Other measurements may include layer thicknesses, layer uniformity, roughness, cleanness, or other suitable measurements. In some embodiments, the measurements include results of electrical tests, wafer acceptance tests, optical tests or other suitable tests, which may include pass/fail measurements, reliability measurements, data retention measurements or the like. In some embodiments, the historical process results data 3318 are related to a plurality of previously processed semiconductor wafers. In some embodiments, the historical process results data 3318 are related to individual semiconductor wafers, individual runs of semiconductor wafers, and/or individual lots of semiconductor wafers.

In one embodiment, the training set data 3306 links the historical safety data 3308 and/or the historical environmental conditions data 3310 with the historical process results data 3318. In other words, the safety parameters in the historical safety data 3308 and/or the environmental parameters in the environmental conditions data 3310 are linked (e.g., by labeling) to the measurements in the historical process results data 3318. As will be set forth in more detail below, the labeled training set data can be utilized in a machine learning process to train the analysis model 3302 to generate the various forecasts mentioned previously.

In one embodiment, the control system 3324 includes processing resources 3312, memory resources 3314, and communication resources 3316. The processing resources 3312 can include one or more controllers or processors. The processing resources 3312 are configured to execute software instructions, process data, make thin-film etching control decisions, perform signal processing, read data from memory, write data to memory, and to perform other processing operations. The processing resources 3312 can include physical processing resources 3312 and/or virtual processing resources 3312. The processing resources 3312 can include cloud-based processing resources including processors and servers accessed via one or more cloud computing platforms.

In one embodiment, the memory resources 3314 can include one or more computer readable memories. The memory resources 3314 are configured to store software instructions associated with the function of the control system and its components, including, but not limited to, the analysis model 3302. The memory resources 3314 can store data associated with the function of the control system 3224 and its components. The data can include the training set data 3306, current process conditions data, and any other data associated with the operation of the control system 3224 or any of its components. The memory resources 3314 can include physical memory resources and/or virtual memory resources. The memory resources 3314 can include cloud-based memory resources accessed via one or more cloud computing platforms. In some embodiments, the memory resources 3314 include the database 152.

In one embodiment, the communication resources 3316 can include wired and wireless communication resources, which can facilitate communication via one or more networks such as wired networks, wireless networks, the Internet, or an intranet. The communication resources 3316 can enable components of the control system 3224 to communicate with each other.

FIG. 3B is a block diagram illustrating operational aspects and training aspects of the analysis model 3302 of FIG. 3A, according to one embodiment. As described previously, the training set data 3306 includes data related to a plurality of previously processed semiconductor wafers. Each previously processed semiconductor wafer was processed with particular environmental conditions and resulted in a particular processing result. The materials 122 provider, expiration, temperature, light, acclimation, humidity, usage time, transfer time, and/or other suitable parameters for each previously processed semiconductor wafer are formatted into a respective material conditions matrix 3352. The material conditions matrix 3352 includes a plurality of data vectors 3354. Each data vector 3354 corresponds to a particular parameter.

The example of FIG. 3B illustrates a single material conditions matrix 3352 that will be passed to the analysis model 3302 during the training process. In the example of FIG. 3B, the material conditions matrix 3352 includes nine data vectors 3354, each corresponding to an environmental or safety parameter of the materials 122. For condition types that are not naturally represented in numbers, such as material 3354C, a number can be assigned to each possible material.

The analysis model 3302 includes a plurality of neural layers 3356a-e. Each neural layer includes a plurality of nodes 3358. Each node 3358 can also be called a neuron. Each node 3358 from the first neural layer 3356a receives the data values for each data field from the reflector conditions matrix 3352. Accordingly, in the example of FIG. 3B, each node 3358 from the first neural layer 3356a receives 36 data values because the reflector conditions matrix 3352 has 36 data scalars (9*4=36). Each neuron 3358 includes a respective internal mathematical function labeled F(x) in FIG. 3B. Each node 3358 of the first neural layer 3356a generates a scalar value by applying the internal mathematical function F(x) to the data values from the data fields 3354 of the reflector conditions matrix 3352. Further details regarding the internal mathematical functions F(x) are provided below.

Each node 3358 of the second neural layer 3356b receives the scalar values generated by each node 3358 of the first neural layer 3356a. Accordingly, in the example of FIG. 3B each node of the second neural layer 3356b receives four scalar values because there are four nodes 3358 in the first neural layer 3356a. Each node 3358 of the second neural layer 3356b generates a scalar value by applying the respective internal mathematical function F(x) to the scalar values from the first neural layer 3356a.

Each node 3358 of the third neural layer 3356c receives the scalar values generated by each node 3358 of the second neural layer 3356b. Accordingly, in the example of FIG. 3B, each node of the third neural layer 3356c receives five scalar values because there are five nodes 3358 in the second neural layer 3356b. Each node 3358 of the third neural layer 3356c generates a scalar value by applying the respective internal mathematical function F(x) to the scalar values from the nodes 3358 of the second neural layer 3356b.

Each node 3358 of the neural layer 3356d receives the scalar values generated by each node 3358 of the previous neural layer (not shown). Each node 3358 of the neural layer 3356d generates a scalar value by applying the respective internal mathematical function F(x) to the scalar values from the nodes 3358 of the second neural layer 3356b.

The final neural layer includes only a single node 3358. The final neural layer receives the scalar values generated by each node 3358 of the previous neural layer 3356d. The node 3358 of the final neural layer 3356e generates a data value 3368 by applying a mathematical function F(x) to the scalar values received from the nodes 3358 of the neural layer 3356d.

In the example of FIG. 3B, the data value 3368 corresponds to the predicted expiration of a carrier 121 of the materials 122 generated by data corresponding to values included in the material conditions matrix 3352. In other embodiments, the final neural layer 3356e may generate multiple data values each corresponding to a particular material characteristic such as quality, safety, or other characteristics of the materials 122. In some embodiments, the final neural layer 3356e may generate data values corresponding to the various forecasts described above. The final neural layer 3356e will include a respective node 3358 for each output data value to be generated. In the case of a predicted expiration, engineers can provide constraints that specify that the predicted expiration 3368 fall within a selected range, such as greater than 1 hour, in one example. The analysis model 3302 will adjust internal functions F(x) to ensure that the data value 3368 corresponding to the predicted expiration will fall within the specified range.

During the machine learning process, the analysis model compares the predicted expiration in the data value 3368 to the actual expiration of the materials 122 as indicated by the data value 3370. As set forth previously, the training set data 3306 includes, for each set of historical environmental conditions data, historic process results data indicating the characteristics of the semiconductor wafer that resulted from the fabricating process. Accordingly, the data field 3370 includes the actual expiration of the materials 122 that resulted from the fabricating process reflected in the material conditions matrix 3352. The analysis model 3302 compares the predicted expiration from the data value 3368 to the actual expiration from the data value 3370. The analysis model 3302 generates an error value 3372 indicating the error or difference between the predicted expiration from the data value 3368 and the actual expiration from the data value 3370. The error value 3372 is utilized to train the analysis model 3302.

The training of the analysis model 3302 can be more fully understood by discussing the internal mathematical functions F(x). While all of the nodes 3358 are labeled with an internal mathematical function F(x), the mathematical function F(x) of each node is unique. In one example, each internal mathematical function has the following form:

$$F(x) = x1*w1 + x2*w2 + \ldots xn*w1 + b.$$

In the equation above, each value x1-xn corresponds to a data value received from a node 3358 in the previous neural layer, or, in the case of the first neural layer 3356a, each value x1-xn corresponds to a respective data value from the data fields 3354 of the reflector conditions matrix 3352. Accordingly, n for a given node is equal to the number of nodes in the previous neural layer. The values w1-wn are scalar weighting values associated with a corresponding node from the previous layer. The analysis model 3302 selects the values of the weighting values w1-wn. The constant b is a scalar biasing value and may also be multiplied by a weighting value. The value generated by a node 3358 is based on the weighting values w1-wn. Accordingly, each node 3358 has n weighting values w1-wn. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 3372 has been calculated, the analysis model 3302 adjusts the weighting values w1-wn for the various nodes 3358 of the various neural layers 3356a-3356e. After the analysis model 3302 adjusts the weighting values w1-wn, the analysis model 3302 again provides the reflector conditions matrix 3352 to the input neural layer 3356a. Because the weighting values are different for the various nodes 3358 of the analysis model 3302, the predicted reflectivity 3368 will be different than in the previous iteration. The analysis model 3302 again generates an error value 3372 by comparing the actual reflectivity 3370 to the predicted reflectivity 3368.

The analysis model 3302 again adjusts the weighting values w1-wn associated with the various nodes 3358. The analysis model 3302 again processes the material conditions matrix 3352 and generates a predicted expiration 3368 and associated error value 3372. The training process includes adjusting the weighting values w1-wn in iterations until the error value 3372 is minimized.

FIG. 3B illustrates a single material conditions matrix 3352 being passed to the analysis model 3302. In practice, the training process includes passing a large number of material conditions matrices 3352 through the analysis model 3302, generating a predicted expiration 3368 for each material conditions matrix 3352, and generating associated error value 3372 for each predicted expiration. The training process can also include generating an aggregated error value indicating the average error for all the predicted expirations for a batch of material conditions matrices 3352. The analysis model 3302 adjusts the weighting values w1-wn after processing each batch of material conditions matrices 3352. The training process continues until the average error across all material conditions matrices 3352 is less than a selected threshold tolerance. When the average error is less than the selected threshold tolerance, the analysis model 3302 training is complete and the analysis model is trained to accurately predict the expiration of the materials 122 based on the environmental conditions and/or safety conditions. The analysis model 3302 can then be used to predict expirations and to select environmental and/or safety conditions that will result in lengthened expiration. During use of the trained model 3302, an environmental conditions vector or matrix, representing current environmental conditions for a current materials 122, and having similar format as the material conditions matrix 3352, is provided to the trained analysis model 3302. The trained analysis model 3302 can then predict the expiration of the materials 122 that will result from those environmental conditions.

A particular example of a neural network based analysis model 3302 has been described in relation to FIG. 3B. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure. In addition, the neural network based analysis model 3302 may generate any of the previously described forecasts, such as quality parameters (e.g., expiration) and/or safety parameters (e.g., leakage) of the materials 122, consumption of the materials 122, order of transfer of the materials 122 from the warehouse 130 and/or the staging area 142, procurement of the materials 122 from the materials supplier 120, control/management of inventory of the materials 122, and/or other suitable forecasts.

Based on the above, and with reference to FIG. 3C, a process 3400 for managing the materials 122 based on the neural network based analysis model 3302 may include forecasting quality and/or safety parameters of a carrier 121 containing the materials 122 (e.g., on a run-to-run or lot-to-lot basis), corresponding to operation 3410. The process 3400 may further include accepting or rejecting the carrier 121 based on the forecast generated in operation 3410, corresponding to operation 3420. The carrier 121 may be analyzed, for example, to determine whether the material 122 contained therein is expired in operation 3430. Based on the analysis performed in operation 3430, the neural network based analysis model 3302 may be updated to improve forecasting of the quality/safety parameters of future carriers in operation 3410.

Embodiments may provide advantages. The methods and systems for managing materials 122, such as photoresist, ensure freshness, safety and timely fulfillment, which increases yield and reduces tool downtime. The material management system is capable of substantially real-time response when managing raw material quality and safety. Through intelligent and purposeful use of smart tags and response systems, material aging issues and contamination can be effectively prevented. Environmental sensing and big data collection and forecasting also improve quality control, materials tracking, production reliability, data mining and smart control, while reducing operator error.

In accordance with at least one embodiment, a method comprises: storing a carrier containing material in a storage; recording environmental data of the storage to a database while the material is in the storage; generating a forecast for the material in the carrier based on the environmental data; receiving a request for the material from a semiconductor fabrication tool; and providing the carrier to the semiconductor fabrication tool based on the forecast.

In accordance with at least one embodiment, a method comprises: installing a carrier containing material to a fabrication tool for processing a semiconductor wafer; writing environmental data of the fabrication tool to a database while the carrier is installed; generating a forecast for the material in the carrier based on the environmental data; and removing the carrier from the fabrication tool based on the forecast prior to the material in the carrier being exhausted.

In accordance with at least one embodiment, a system comprises a carrier, a storage, at least one environmental sensor, at least one safety sensor, a database and a microcontroller unit. The carrier is configured to contain a material, and includes at least one tag. The storage is configured to store the carrier, and includes at least one reader configured to read the tag. The at least one environmental sensor is configured to generate environmental data corresponding to at least the storage. The at least one safety sensor is configured to generate safety data corresponding to at least the carrier or the storage. The database is configured to store the environmental data and the safety data. The microcontroller unit is configured to forecast at least one quality parameter or safety parameter of the material based on the environmental data and the safety data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    storing a carrier containing a material in a storage;
    recording first environmental data and first safety data associated with the material by a transport vehicle that transits the carrier from a materials supplier to the storage;
    recording second environmental data of the storage to a database while the material is in the storage;
    recording second safety data of the carrier to the database while the material is in the storage;
    recording acclimation time of the material at a staging area;
    generating a forecast of expiration of the material based on the first environmental data, the second environmental data, the first safety data, the second safety data and the acclimation time;
    providing the carrier to a semiconductor fabrication tool based on the forecasted expiration of the material; and
    processing a semiconductor wafer by the material.

2. The method of claim 1, further comprising recording third safety data during transit of the carrier from the storage to the semiconductor fabrication tool.

3. The method of claim 2, wherein the transit of the carrier from the storage to the semiconductor fabrication tool includes transit of the carrier from the storage to the staging area and transit of the carrier from the staging area to the semiconductor fabrication tool.

4. The method of claim 1, wherein the second safety data includes activation information of at least one of an anti-drop mechanism, a leakage isolation, an air exhaust mechanism, or an air purge mechanism of the carrier.

5. The method of claim 1, further comprising:
    training a neural network of an analysis model with information indicative of photoresist expiration based on historical environmental conditions data and historical safety data to predict expiration of photoresist after transit and storage has been performed;
    wherein the forecast is generated based on the neural network.

6. The method of claim 1, wherein the first environmental data includes at least one of a temperature data, pH ("potential of hydrogen") data, humidity data, light data, vibration data, electrostatic discharge (ESD) data, cleanliness data, leakage data, pressure data or particulate data.

7. The method of claim 1, further comprising:
detecting a leak by a leak detector in fluidic communication with a drain of the storage that is configured to receive the material when the carrier has the leak.

8. A method, comprising:
training a neural network of an analysis model with information indicative of material expiration based on historical environmental conditions data and historical safety data to predict expiration of the material after transit and storage have been performed;
installing a first carrier containing first material to a fabrication tool for processing a semiconductor wafer;
writing environmental data of the fabrication tool to a database while the carrier is installed;
generating a forecast, by a microcontroller unit, of expiration of the first material in the first carrier based on the environmental data, the historical environmental conditions data and the historical safety data;
processing a semiconductor wafer by the first material in the first carrier;
removing the first carrier from the fabrication tool based on the forecasted expiration of the first material prior to the first material in the first carrier being exhausted;
installing a second carrier containing the first material to the fabrication tool after the carrier is removed; and
processing the semiconductor wafer by the first material in the second carrier.

9. The method of claim 8, further comprising retrieving the first carrier from a staging area prior to the second carrier based on the forecast.

10. The method of claim 9, wherein the first carrier is retrieved prior to the second carrier based on a first predicted expiration of the carrier being earlier than a second predicted expiration of the second carrier.

11. The method of claim 9, further comprising recording acclimation time of the first material at the staging area, wherein the forecast is generated based on the acclimation time.

12. The method of claim 8, wherein installing the first carrier includes installing the first carrier containing photoresist into a photoresist coater.

13. The method of claim 8, wherein the writing environmental data includes writing at least one of a temperature data, pH ("potential of hydrogen") data, humidity data, light data, vibration data, electrostatic discharge (ESD) data, cleanliness data, leakage data, pressure data or particulate data.

14. A system, comprising:
a carrier configured to contain a material;
a storage configured to store the carrier;
at least one environmental sensor configured to generate environmental data corresponding to at least the storage;
at least one safety sensor configured to generate safety data corresponding to at least the carrier or the storage;
a database configured to store the environmental data and the safety data; and
a microcontroller unit configured to determine at least one quality parameter or safety parameter of the material based on the environmental data and the safety data and based on a neural network of an analysis model trained with information indicative of expiration of the material based on historical environmental conditions data and historical safety data to predict expiration of the material after transit and storage have been performed.

15. The system of claim 14, wherein the storage includes a freezer.

16. The system of claim 15, wherein the storage includes an interlock, and the safety sensor includes an interlock sensor configured to generate information corresponding to the interlock.

17. The system of claim 14, wherein the microcontroller unit is configured to generate an analysis module.

18. The system of claim 17, wherein the microcontroller unit is further configured to accept or reject the carrier based on the at least one quality parameter or safety parameter.

19. The system of claim 14, wherein the at least one environmental sensor includes at least one of a temperature, pH ("potential of hydrogen"), humidity, light, vibration, electrostatic discharge (ESD), cleanliness, leakage, pressure or particulate sensor.

20. The system of claim 14, wherein the storage includes a drain configured to receive the materials when the carrier has a leak, and a leak detector in fluidic communication with the drain configured to detect the leak.

* * * * *